(12) United States Patent
Jansman

(10) Patent No.: US 8,138,855 B2
(45) Date of Patent: Mar. 20, 2012

(54) DEVICE WITH AN ELECTROACOUSTIC BALUN

(75) Inventor: Andreas Bernardus Maria Jansman, Nuenen (NL)

(73) Assignee: NXP B.V., Eindhoven (NL)

( * ) Notice: Subject to any disclaimer, the term of this patent is extended or adjusted under 35 U.S.C. 154(b) by 310 days.

(21) Appl. No.: 12/542,544

(22) Filed: Aug. 17, 2009

(65) Prior Publication Data

US 2010/0244988 A1  Sep. 30, 2010

(30) Foreign Application Priority Data

Mar. 30, 2009 (EP) ..................... 09156769

(51) Int. Cl.
*H03H 9/00* (2006.01)
*H01L 41/00* (2006.01)
(52) U.S. Cl. ..................... 333/133; 333/193
(58) Field of Classification Search .............. 333/133, 333/193, 194, 195, 196; 310/313 A
See application file for complete search history.

(56) References Cited

U.S. PATENT DOCUMENTS

| | | | |
|---|---|---|---|
| 3,018,451 A | 1/1962 | Mattiat | |
| 4,633,204 A | 12/1986 | Gounji et al. | |
| 5,576,590 A | 11/1996 | Ohnishi et al. | |
| 6,448,695 B2 | 9/2002 | Milsom | |
| 6,670,866 B2 | 12/2003 | Ella et al. | |
| 6,734,600 B2 | 5/2004 | Aigner et al. | |
| 6,917,261 B2 | 7/2005 | Unterberger | |
| 6,963,257 B2 | 11/2005 | Ella et al. | |
| 6,975,183 B2 | 12/2005 | Aigner et al. | |
| 7,038,551 B2 * | 5/2006 | Kearns | ............ 331/133 |
| 7,057,478 B2 | 6/2006 | Korden et al. | |
| 7,091,649 B2 | 8/2006 | Larson et al. | |
| 7,098,758 B2 | 8/2006 | Wang et al. | |
| 2007/0267942 A1 * | 11/2007 | Matsumoto et al. | ...... 310/313 A |

FOREIGN PATENT DOCUMENTS

| | | |
|---|---|---|
| JP | 60070814 A | 4/1985 |
| JP | 60150310 A | 8/1985 |

OTHER PUBLICATIONS

Land C.E, "Transistor Oscillators Employing Piezoelectric Ceramic Feedback Networks", IEEE International Convention Record, IEEE Inc., New York, vol. 13, Mar. 1, 1965, pp. 51-68.

* cited by examiner

*Primary Examiner* — Dean O Takaoka

(57) ABSTRACT

A device has an electroacoustic interface between interfaces for balanced electrical signals and unbalanced electrical signals (i.e. a balun) includes a film of piezoelectric material having a first and second pair of electrodes on a first surface a common electrode, with at least partial overlaps with all of the electrodes of the first and second pair, on a second surface. The interfaces between the electrodes in the first and second pair have geometrically identical shapes. Piezoelectrically polarized regions are provided in the film at the overlaps of the electrodes with the electrode arrangement. The direction of polarization components of the regions in the overlaps with the first electrode and the second electrode in the first pair are equal to each other. To provide for balun coupling, the directions of the polarization components in the overlaps with the first electrode and the second electrode in the second pair are mutually opposite.

15 Claims, 3 Drawing Sheets

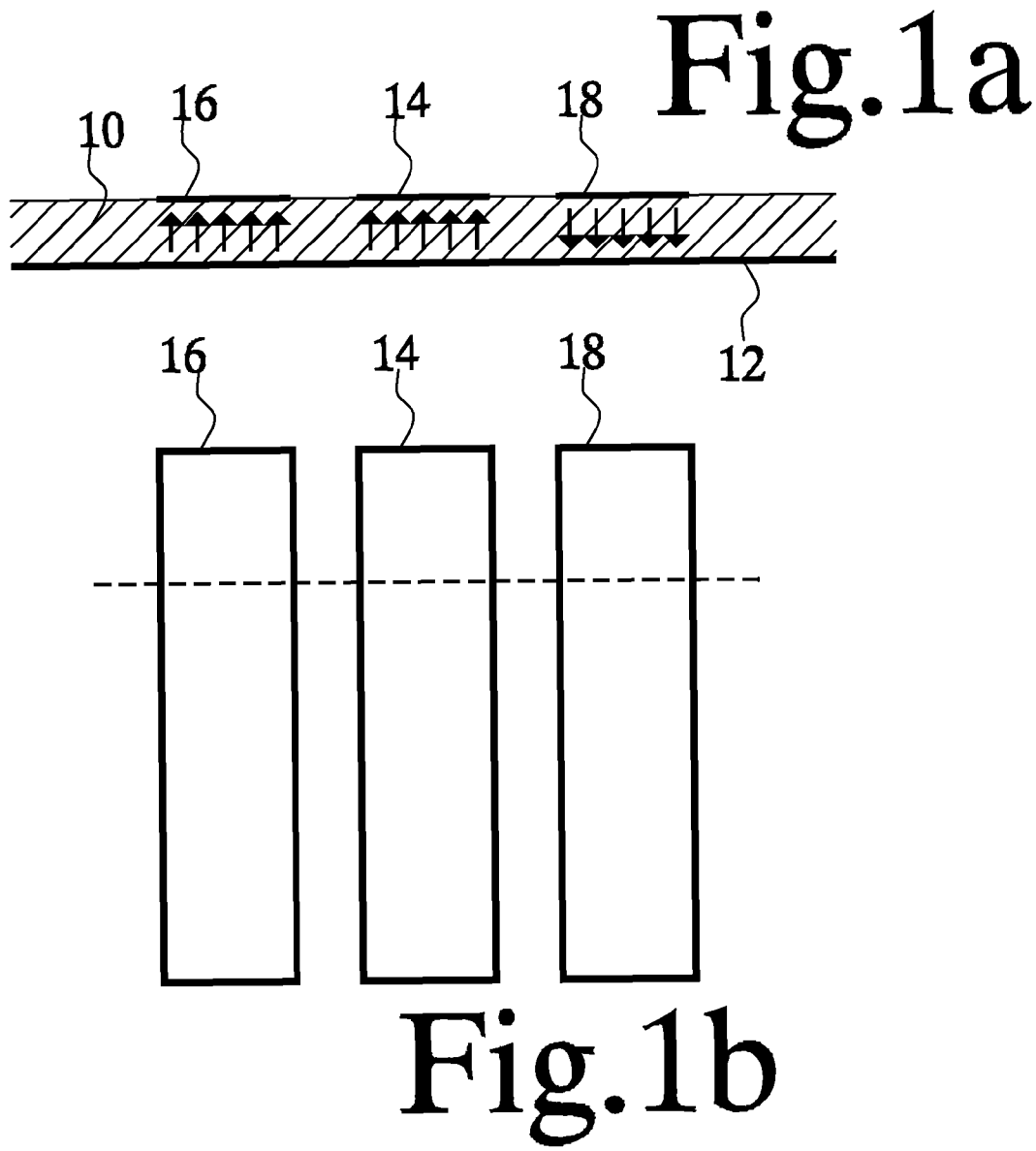
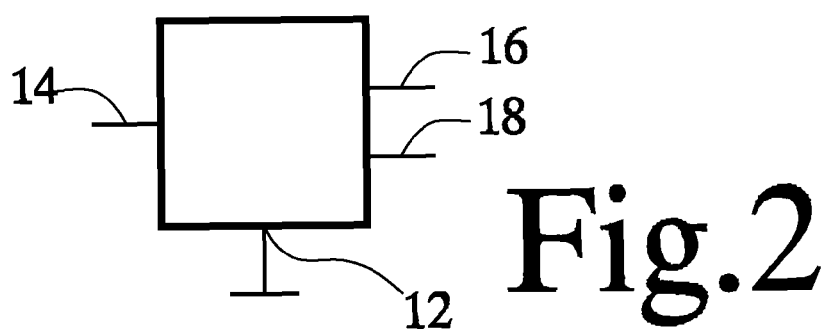

DEVICE WITH AN ELECTROACOUSTIC BALUN

CROSS-REFERENCE TO RELATED APPLICATIONS

The current application claims priority from European Patent application, serial number EP09156769.3, filed Mar. 30, 2009, the entire disclosure of which is incorporated by reference herein.

FIELD OF THE INVENTION

The invention relates to a device that comprises an electroacoustic balun.

BACKGROUND OF THE INVENTION

An electroacoustic balun device is known from U.S. Pat. No. 7,091,649. The balun comprises two stacks, each with two resonant piezoelectric layers, one above the other, with electrodes in the stack on either side of each layer. In operation, voltages are applied between the electrodes of the resonator in a first one of the piezoelectric layers. This results in acoustic vibrations in the resonator in the first piezoelectric layer, which are coupled to the second one of the piezoelectric layers so that vibrations also occur in the second piezoelectric layer. Due to the piezoelectric effect this in turn results in a voltage across the electrodes of the second piezoelectric layer.

U.S. Pat. No. 7,091,649 describes a device with two of such stacks, using separate electrodes. In operation, voltages are applied between the electrodes of the resonators of both stacks in the first piezoelectric layer, to produce voltages between the electrodes of the resonators in the second piezoelectric layer. The polarization of the piezoelectric layers is set differently in the different stacks, in order to create a phase relation between the resulting voltages from the resonators in the second layer so that the series connection of these resonators produces twice the voltage applied to the series connection of the resonators in the first layer. Thus balun functionality can be realized.

Polarization differences in a piezoelectric layer have also been used for other purposes. U.S. Pat. No. 3,018,415 discloses a resonator comprising a piezoelectric crystal with two electrodes on respective sides of the crystal. In order to suppress undesirable vibration modes, at least one of the electrodes is shaped into a central disc and a surrounding ring, and the polarization of the crystal is set in mutually opposite directions below the disc and the ring respectively.

U.S. Pat. No. 5,576,590 discloses an electroacoustic transformer with a driver part and a generator part. The transformer comprises a piezoelectric plate. In the driver part, electrodes are attached on mutually opposite sides of the plate to excite acoustic vibrations. These vibrations travel outward from the driver part as an acoustic wave with longitudinal polarization (i.e., with vibrating movement in the direction of propagation in the plane of the plate). The generator part comprises electrodes at different positions on the plate. In the generator part, the plate is polarized between these positions in order to convert the waves into electric fields in the plane of the plate between the electrodes.

U.S. Pat. No. 6,448,695 discloses a frequency bandpass filter that is formed using a series arrangement of acoustic resonators. Coupling between the resonators is realized acoustically rather than electronically, by means of lateral wave coupling.

SUMMARY OF THE INVENTION

A device having an electroacoustic interface between interfaces for balanced electrical signals and unbalanced electrical signals (i.e. a balun) is disclosed. In an embodiment, an electroacoustic balun includes at least three electrodes on the same surface of a film, which may act as terminals of the balun. The edges of the electrodes face each other in two identical interfaces. The directions of the components of piezoelectric polarization perpendicular to the film are the same underneath the electrodes of one interface. Underneath the electrodes of the other interface the directions of these components are mutually opposite. Thus a single piezoelectric film is sufficient to form the acoustic part of a balun. When resonant operation is used, the use of the same film makes it easy to match the resonance frequencies.

In an embodiment, the interfaces are realized between a first electrode and separate second electrodes. Thus, only three electrodes are required, which provides for a compact design. In a further embodiment, the first electrode has a mirror symmetric shape, with the second electrodes facing edges of the first electrode that are related by a symmetry transformation. Thus, coupling to the second electrodes can be easily matched.

In another embodiment, two first electrodes are used on the surface of the film, electrically connected to each other, each with an interface to a respective second electrode. The second electrodes are located between the first electrodes. In this way, further coupling from the second electrodes can be easily avoided. In a further embodiment, the first electrodes have identical shape. This makes it easy to improve matching of resonance frequencies. In another embodiment, the polarization components underneath the two first electrodes have mutually opposite directions. In this way, a large region with the same polarization direction can be used underneath the other first electrode and the second electrodes.

In a further embodiment, the second electrodes have identical shapes. This makes it easy to improve matching of resonance frequencies. In another embodiment, a common electrode is used on the surface opposite the first and second electrodes, having overlaps with the first and second electrodes. Alternatively, separate electrodes may be used on that surface. The use of a common electrode makes it possible to realize a simple structure with little or no height variations.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1a depicts a cross-section of an electroacoustic balun.
FIG. 1b depicts a top view of an electroacoustic balun.
FIG. 2 depicts a black box circuit element.

DETAILED DESCRIPTION OF THE EMBODIMENTS

Figure 3A:
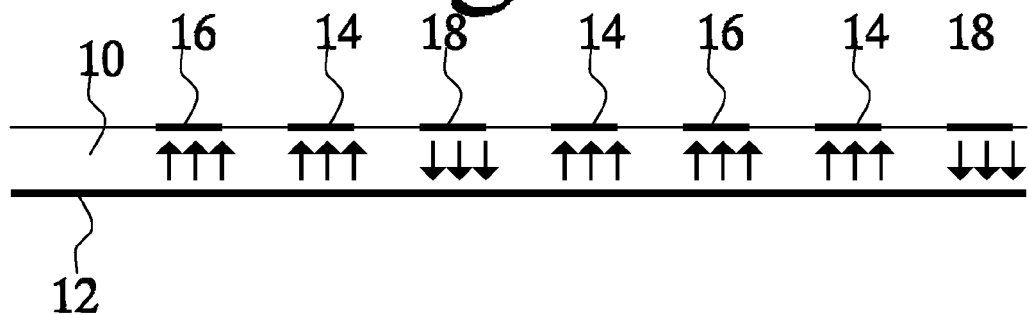
FIGS. 3a and 3b depicts an electroacoustic balun with repeating electrodes.

FIG. 1a depicts a cross-section of an electroacoustic balun comprising a film 10 of piezoelectric material with mutually opposite first and second surfaces, separated by a thickness of the film 10. The surfaces extend over the width of film (from left to right in FIG. 1a) and the length (in the direction perpendicular to the plane of the drawing). Typically, the width and length of film 10 are (much) greater than the thickness of film 10.

A common electrode 12 on the first surface of film 10 and first, second, and third electrodes 14, 16, 18 are provided on the second surface of film 10. First electrode 14 is flanked symmetrically on either side by the second and third electrodes 16, 18. As a result, the interface between first electrode 14 and second electrode 16, i.e., the region on the surface of film 10 between the facing edges of these electrodes, has the same geometrical shape as the interface between first electrode 14 and third electrode 18.

FIG. 1b depicts a top view of the balun, with first, second and third electrodes 14, 16, 18 extending transverse to the cross-section of FIG. 1a (where the cross-section is indicated by the dashed line in FIG. 1b).

FIG. 1a also shows the piezoelectric polarization direction of film 10, by means of arrows. The polarization direction is shown only underneath the electrodes. In principle any polarization direction or unpolarized material may be used in film 10 in regions between the electrodes. The direction in these regions is omitted for clarity. The piezoelectric polarization direction of film 10 is position dependent. Techniques for manufacturing films with position dependent polarization are known per se. As is known per se, the piezoelectric polarization direction of piezoelectric material determines the relation between electric fields and deformations of the film. When an electric field is applied in a first predetermined direction parallel to the direction of polarization the piezoelectric material is compressed along that direction and when the electric field is applied in the opposite direction the piezoelectric material expands. Vice versa, expansion and compression along the direction of polarization result in mutually opposite electric fields parallel to that direction.

Between common electrode 12 and first and second electrode 14, 16 the polarization direction of film 10 is directed from common electrode 12 to first and second electrode 14, 16 respectively. In contrast, between common electrode 12 and third electrode 18 the polarization direction of film 10 is directed oppositely, from third electrode 18 to common electrode 12. Except for these direction differences, the geometric shape of the interface between the polarized regions of the first electrode 14 and the second electrode 16, i.e., of the facing edges of these regions and the relative positions of these edges, is the same as the geometric shape of the interface between the polarized regions for the first electrode 14 and third electrode 18.

FIG. 2 shows a black box model of the balun, with a ground connection coupled to common electrode 12 and a first and second interface side, for single sided signals relative to ground and for symmetric signals on mutually opposite sides of ground respectively. The first interface side has one terminal, connected to first electrode 14. The second interface side has two terminals, connected to second and third electrodes 16, 18. The first interface side may be used as input for a single sided signal, for example, in order to produce a differential signal on the second interface side. The device may also be used reciprocally, using the second interface side as the input and the first interface side as the output.

In an example of operation, an AC electric voltage is applied between first electrode 14 and common electrode 12 in an overlap area of film 10 where first electrode 14 and common electrode 12 overlap. This results in vibration of the material of film 10, with oscillating displacements in a direction from first electrode 14 to common electrode 12, perpendicular to the plane of the film. These oscillating displacements occur mainly in the overlap area of film 10, with an amplitude that gradually decays outside the overlap area with distance from the overlap area. The device may comprise a signal generator (not shown) coupled to the electrodes to generate or supply the AC electric voltage, depending on whether the signal generator is on the transmitter or receiver side. In an embodiment, the signal generator generates or supplies a signal with spectral content over the full bandwidth of the standard followed, not only at the center frequency, which coincides with the baluns resonance frequency. For example, for the US-PCS standard, the transmit bandwidth is 60 MHz around a center frequency of 1880 MHz (5% relative bandwidth). All standards that can be served by bulk acoustic wave (BAW) balun technology have relative bandwidths well below 20%.

Due to the gradual decay, some oscillating displacement in film 10 occurs in further overlap areas of common electrode 12 with second and third electrodes 16, 18, respectively. Due to the piezoelectric polarization of film 10 in these further overlap areas, these oscillating displacements result in electric voltages between common electrode 12 and second and third electrodes 16, 18, respectively. Because the polarization directions of film 10 adjacent second and third electrodes 16, 18 are mutually opposite, the voltage difference from second electrode 16 to common electrode 12 is opposite to the voltage difference from third electrode 18 to common electrode 12. Because the interfaces from first electrode 14 to second and third electrodes 16, 18 are geometrically identical (same distance between the edges of the electrodes, same interface length), the size of these voltages is substantially the same. Relative to each other, second and third electrodes 16, 18 carry a differential voltage, with a common mode voltage that corresponds to the voltage of common electrode 12. Thus, one form of balun functionality, i.e., conversion from unbalanced to balanced signals, is realized.

In an embodiment, measures may be taken to prevent or reduce leakage of vibration energy outside of film 10. Such measures are known per se. Thus, for example, a cavity (not shown) may be provided between a substrate (not shown) that supports film 10 in the area of the electrodes. In another embodiment an acoustically reflective layer structure (not shown) may be realized between the bulk of the substrate and film 10.

Film 10 between first electrode 14 and common electrode 12 typically behaves as a first resonator, based on acoustic waves trapped in the film between the electrodes, with a resonance frequency determined by the thickness of film 10. The resonance frequency may also be affected by electrodes 12, 14 (16, 18) and other layers in the layer stack, if present. Similarly, film 10 between second electrode 16 and common electrode 12 behaves as a second resonator and film 10 between third electrode 18 and common electrode 12 behaves as a third resonator. Because the same film 10 is used in each of these resonators, the resonance frequencies of these resonator can easily be matched and frequency matching is independent of overall film thickness. Other factors that affect the resonance frequency, if any, can be matched by means of layout design. This should be contrasted with the case of matching resonators at different vertical positions, which depends on the relation between thicknesses of different layers.

Preferably, the frequency of the applied AC voltages is taken at or near a resonance frequency of the resonators. This results in optimal coupling. Moreover the resonant behavior may be used to realize a frequency selective filter operation. The device may comprise a signal generator (not shown) configured to generate an AC electric voltage at this frequency. The signal generator may be coupled to the electrodes to supply the AC electric voltage.

Although one form of operation has been described by way of example, it should be appreciated that other forms of operation may be used. For example, mutually opposite voltages may be applied to second and third electrodes 16, 18 relative to common electrode 12 to obtain a single ended voltage at first electrode 14 relative to common electrode 12. In this way, conversion from balanced to unbalanced signals with strong common-mode rejection, which is one form of balun functionality, is realized. A combination of application of voltages to first electrode 14 and to second and third electrodes 16, 18 may be used. Load impedances may be coupled to the electrodes, so that AC current may flow from the electrodes and the voltages at the electrodes will be determined by the load impedance.

Furthermore, although one common electrode 12 has been shown, extending over the area of film 10 that is covered by all of first, second, and third electrodes 14, 16, 18, it should be appreciated that common electrode 12 may be split into parts that face respective ones of first, second, and third electrodes 14, 16, 18, or parts of these electrodes. Also, although one first electrode 14, one second electrode 16, and one third electrode 18 are shown, it should be appreciated that a plurality of such electrodes may be used, for example, in an interdigitated pattern.

Figure 3B:
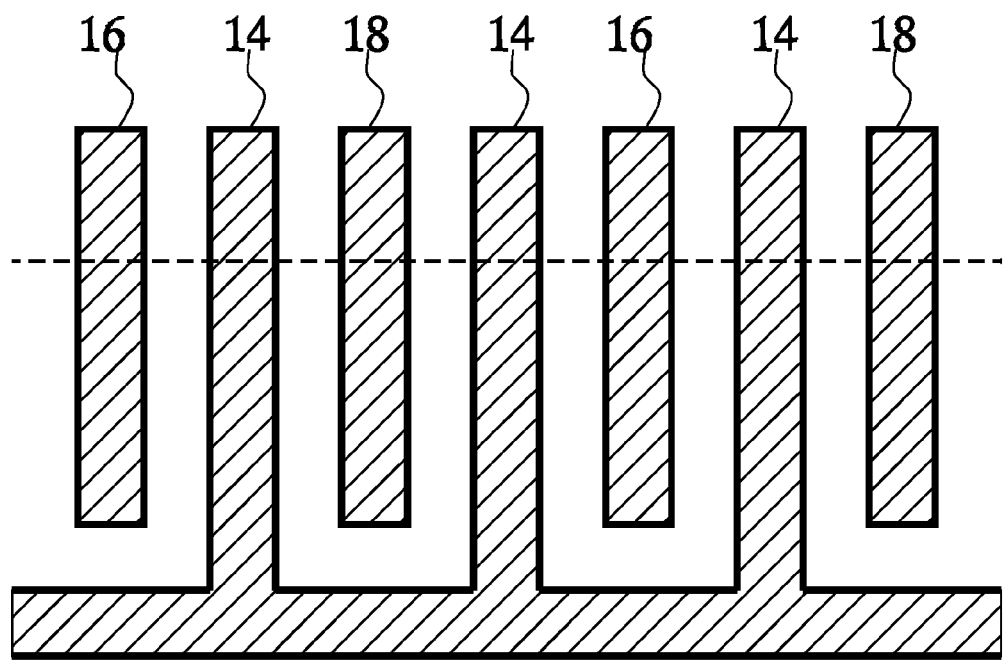

FIGS. 3a and 3b depict an embodiment of a repetitive pattern of electrodes. All second electrodes 16 from the repetitive pattern may be electrically connected. Similarly, all third electrodes 18 from the repetitive pattern may be electrically connected. Although a repetition of the pattern, second electrode 16, first electrode 14, third electrode 18, first electrode 14, is shown, it should be appreciated that other repetitive patterns may be used. Preferably the geometry has a symmetry that maps second electrodes 16 onto third electrodes 18, with inverted polarization and vice versa and that maps first electrode 14 onto first electrodes 14. A mirror symmetry may be used for example. Other examples include a pattern, second electrode 16, first electrode 14, second electrode 16, first electrode 14, third electrode 18, first electrode 14, third electrode 18, first electrode 14, or of the pattern, first electrode 14, second electrode 16, third electrode 18.

Figure 4:
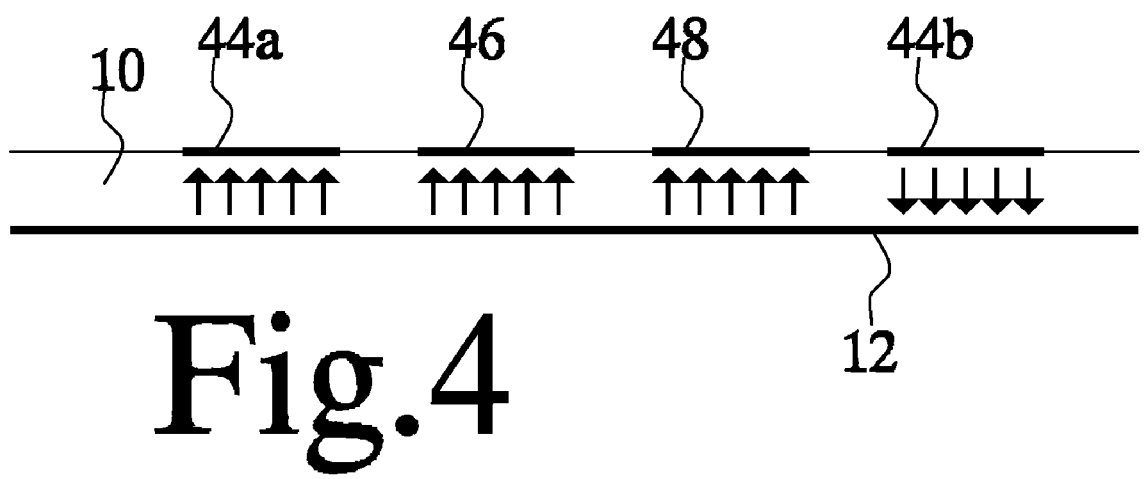
FIG. 4 depicts a cross-section of an electroacoustic balun.
Throughout the description, similar reference numbers may be used to identify similar elements

FIG. 4 shows a cross-section of an electroacoustic balun of another embodiment, wherein four electrodes 44a, 44b, 46, 48 are provided on one surface of film 10 opposite a common electrode 12 on the opposite surface of film 10. Two first electrodes 44a and 44b are provided and between first electrodes 44a and 44b a second electrode 46 and a third electrode 48 are provided, so that the geometry is mirror symmetric about a symmetry axis between second electrode 46 and third electrode 48. The first electrodes may be coupled electrically to each other so that they will carry the same electric potential. The polarization of film 10 has a first direction perpendicular to the surface of film 10 from common electrode 12 to a first one of first electrodes 44a, second electrode 46 and third electrode 46. The polarization of film 10 has a second direction perpendicular to the surface of film 10 from a second one of first electrodes 44b to common electrode 12. The first and second directions are mutually opposite. The geometrical shape of the interface between the second electrode 46 and its adjacent first electrode 44a is identical to the geometrical shape of the interface between the third electrode 48 and its adjacent first electrode 44b. As may be noted, this device has a large region underneath first electrode 44a and second and third electrodes 46 and 48 where the polarization direction need not change. This simplifies the layout of the polarization.

In an example of operation, an AC voltage is applied between first electrodes 44a,b on one hand and common electrode 12 on the other hand. Due to the piezoelectric effect this results in oscillating displacement of the material of film 10, with a decaying amplitude outside the overlap area between first electrodes 44a, 44b and common electrode 12. Some oscillating displacement also occurs in further overlap areas, between common electrode 12 and second and third electrodes 46, 48, respectively. Due to the piezoelectric polarization of film 10 this results in voltages between common electrode 12 and second and third electrodes 46, 48, respectively. Because the polarizations underneath second electrode 46 and its closest first electrode 44a are the same, whereas the polarizations underneath third electrode 48 and its closest first electrode 44b are different, the voltages at second and third electrodes 46, 48 relative to common electrode 12 are mutually opposite. Thus balun operation is realized.

It can be seen that the resulting displacement profile is substantially anti-symmetric with respect to a mirror axis. The displacement pattern at first electrode 44a corresponds to compression in film 10 at time points when the displacement at second electrode 44b corresponds to expansion, and vice versa. This is because the polarization at first electrodes 44a and 44b is opposite. Such a profile leads to opposite voltages at second and third electrodes 46, 48 relative to the common electrode 12, corresponding to balun operation.

It should be appreciated that this effect can be achieved in different ways. A similar effect is achieved as long as there is a polarization change in one of the second-closest first electrode pair and the third-closest first electrode pairs. A repetition of the pattern electrodes may be used, a repetition of first electrode 44a (=first electrode 44b of previous repetition), second electrode 46, third electrode 48 may be used, even and odd repetitions having mutually opposite piezoelectric polarity patterns. All second electrodes 46 from the repetition may be electrically connected. Similarly, all third electrodes 48 from the repetition may be electrically connected. In a further embodiment, the sequence of the second and third electrodes 46, 48 in odd repetitions may be inverted compared to the sequence in FIG. 4 (for even repetitions).

The substantial similarity of the geometrical shapes of the interfaces between electrode pairs provides for symmetric, equal sized voltages at the second and third electrodes. Interfaces are said to be geometrically identical even if they differ by a mirror symmetry, or a rotation symmetry. Obviously insubstantial differences between the interface shapes that do not result in substantial voltage size differences may be acceptable.

The equality of the size of the voltages may also be influenced by the acoustic mode shapes in the electrodes, although the effect of the shape may be small because modes with displacement of film material perpendicular to the film surface is used. Preferably, the electrodes are shaped geometrically so that the acoustic mode amplitudes are similar at the interfaces. Identically shaped first electrodes 44a, 44b, or symmetrically shaped first electrodes 14 (with symmetrically related edges facing the second and third electrodes) may be used to ensure this. Similarly, the shape of the second and third electrodes is preferably selected to be the same, with identically related edges of the second and third electrodes facing the first electrode or electrodes.

Film 10 may be manufactured for example by deposition techniques during a manufacturing process that comprises several deposition steps and optional patterning steps (photolithographic patterning may be used), which may be use to define the electrodes. In this case, film 10 is a layer that may be combined with other layers in the same device. The thickness of film 10, i.e., the distance between the larger surfaces on which the electrodes are provided, may be selected dependent on the desired resonance frequency.

Although embodiments have been shown with polarizations perpendicular to the plane of film 10, it should be appreciated that any polarization direction transverse to the surface may be used (transverse, i.e., not parallel to it and preferably deviating not more than forty-five degrees from the perpendicular). Mutually opposite perpendicular polarization components of transverse polarization are sufficient to realize opposite voltages. Polarization perpendicular to the film is preferred as it results in maximum voltages. As used herein "polarization component" in a direction refers to the projection of the polarization vector in that direction. It does not exclude that this polarization component is the only component, constituting the entire polarization.

Although an embodiment has been shown wherein all electrodes at least partly have an elongated rectangular shape, it should be appreciated that other shapes may be used. For example, the first electrode could be ring shaped and the second and third electrodes could be realized as half rings concentric with the ring shape of the first electrode, e.g., both inside the ring of the first electrode, or outside the ring of the first electrode. In the latter case, the first electrode may also be disc shaped. Circular rings may be used, or other shapes such as elliptically shaped rings. The interface between the first electrode and the second electrode can thus easily be given an identical geometric shape as the interface between the first electrode and the third electrode. Also, shapes other than rings may be used. The elongated rectangular shapes have the advantage that they are easy to construct, have simple resonance mode shapes and provide large uniform interfaces between the electrodes.

Although embodiments have been shown wherein homogeneous regions of the polarization extend underneath all of each electrode, which reduces the output impedance, it should be appreciated that the regions need extend only under part of the electrodes, preferably including a region at least extending to the edges of the electrodes where the electrodes face each other.

It should be appreciated that additional features not shown in the Figures may be present in practical devices. Such features may include additional layers for mass loading, adhesion between layers, and frequency tuning. In an embodiment in which solidly mounted resonators are used, additional features may be present to prevent acoustic leakage to the substrate. As such features are not needed to understand the present device and they are known per se from the prior art, these features have not been shown in the Figures, although of course they may also be present in the exemplary embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

What is claimed is:

1. A device having an electroacoustic balun, the device comprising:
a film of piezoelectric material having a first and a second surface separated by a thickness of the film;
a first and second pair of electrodes on the first surface, each pair comprising a first electrode and a second electrode defining an interface between the edges of the first electrode and the second electrode in the pair, the first electrode of the first and second pair being electrically connected to each other or shared by the first and second pair, the interfaces of the first and second pair being shaped geometrically identical to each other;
a common electrode on the second surface, the common electrode having at least partial overlaps with all of the electrodes of the first and second pair; and
piezoelectrically polarized regions in said film at least in part of each of the overlaps, with piezoelectric polarization components perpendicular to the first surface, the direction of the polarization components of the regions in the overlaps with the first electrode and the second electrode in the first pair being equal to each other, the directions of the polarization components in the overlaps with the first electrode and the second electrode in the second pair being mutually opposite.

2. A device according to claim 1, wherein the first and second pair share the first electrode and wherein the second electrodes of the first and second pair are provided on mutually opposite sides of the shared first electrode on said first surface.

3. A device according to claim 2, wherein the first electrode has a mirror symmetric shape and edges of the second electrodes of the first and second pair face mirror symmetrically related edges of the first electrode.

4. A device according to claim 1, wherein the second electrode of the first pair and the second electrode of the second pair are provided both between the first electrode of the first pair and the first electrode of the second pair on the first surface.

5. A device according to claim 4, wherein the first electrode of the first pair and the first electrode of the second pair have identical shape, and edges of the second electrodes of the first and second pair face mutually corresponding edges of the first electrode of the first pair and the first electrode of the second pair on the first surface respectively.

6. A device according to claim 4, wherein the direction of the polarization components of the regions in the overlaps with the first electrodes of the first and second pair are mutually opposite.

7. A device according to claim 1, wherein the second electrodes of the first and second pair have identical shapes.

8. A device according to claim 1, wherein the common electrode overlaps the entire area of all of the electrodes of the first and second pair.

9. A device according to claim 1, comprising an electronic signal supply circuit coupled to at least part of the electrodes and configured to generate an electric signal at a resonance frequency of acoustic waves in the film and to supply said signal to said at least part of the electrodes.

10. A device according to claim 1, comprising an electronic signal supply circuit coupled to at least part of the electrodes and configured to generate an electric signal at a frequency which is within twenty percent of the resonant frequency of acoustic waves in the film and to supply the electrical signal to the at least part of the electrodes.

11. A device according to claim 1, comprising an electronic signal supply circuit coupled to at least part of the electrodes and configured to receive an electric signal at a frequency which is within twenty percent of the resonant frequency of acoustic waves in the film and to supply the electrical signal to the at least part of the electrodes.

12. A method of operating an electroacoustic balun, the method comprising:

in an electroacoustic balun having:

a film of piezoelectric material having a first and a second surface separated by a thickness of the film;

a first and second pair of electrodes on the first surface, each pair comprising a first electrode and a second electrode defining an interface between the edges of the first electrode and the second electrode in the pair, the first electrode of the first and second pair being electrically connected to each other or shared by the first and second pair, the interfaces of the first and second pair being shaped geometrically identical to each other;

a common electrode on the second surface, the common electrode having at least partial overlaps with all of the electrodes of the first and second pair; and piezoelectrically polarized regions in said film at least in part of each of the overlaps, with piezoelectric polarization components perpendicular to the first surface, the direction of the polarization components of the regions in the overlaps with the first electrode and the second electrode in the first pair being equal to each other, the directions of the polarization components in the overlaps with the first electrode and the second electrode in the second pair being mutually opposite:

applying an electrical signal between one of the common electrode and the first electrodes and the common electrode and the second electrodes.

13. A method according to claim 12, comprising applying the electrical signal at a resonance frequency of acoustic waves in the film.

14. A method according to claim 12, comprising an electronic signal supply circuit coupled to at least part of the electrodes and configured to generate an electric signal at a frequency which is within twenty percent of the resonant frequency of acoustic waves in the film and to supply the electrical signal to the at least part of the electrodes.

15. A method according to claim 12, comprising an electronic signal supply circuit coupled to at least part of the electrodes and configured to receive an electric signal at a frequency which is within twenty percent of the resonant frequency of acoustic waves in the film and to supply the electrical signal to the at least part of the electrodes.

* * * * *